US008386879B2

(12) United States Patent
Djordjevic et al.

(10) Patent No.: US 8,386,879 B2
(45) Date of Patent: Feb. 26, 2013

(54) GLDPC ENCODING WITH REED-MULLER COMPONENT CODES FOR OPTICAL COMMUNICATIONS

(75) Inventors: Ivan B Djordjevic, Tucson, AZ (US); Lei Xu, Princeton, NJ (US); Ting Wang, West Windsor, NJ (US); Milorad Cvijetic, Herndon, VA (US)

(73) Assignee: NEC Laboratories America, Inc., Princeton, NJ (US)

( * ) Notice: Subject to any disclaimer, the term of this patent is extended or adjusted under 35 U.S.C. 154(b) by 1051 days.

(21) Appl. No.: 12/189,759

(22) Filed: Aug. 11, 2008

(65) Prior Publication Data

US 2009/0199065 A1 Aug. 6, 2009

Related U.S. Application Data

(60) Provisional application No. 60/954,843, filed on Aug. 9, 2007.

(51) Int. Cl.
*G06F 11/00* (2006.01)
(52) U.S. Cl. .................. 714/752; 714/758; 714/760
(58) Field of Classification Search .................. None
See application file for complete search history.

(56) References Cited

U.S. PATENT DOCUMENTS

| 6,279,132 | B1 * | 8/2001 | Linsky et al. | 714/755 |
|---|---|---|---|---|
| 6,912,685 | B2 * | 6/2005 | Takeda et al. | 714/781 |
| 6,961,387 | B2 * | 11/2005 | Kim et al. | 375/262 |
| 7,331,012 | B2 * | 2/2008 | Vasic et al. | 714/781 |
| 7,783,962 | B2 * | 8/2010 | Kwon et al. | 714/794 |
| 8,015,499 | B2 * | 9/2011 | Kanaoka | 715/780 |
| 2004/0064779 | A1 * | 4/2004 | Vasic et al. | 714/758 |
| 2007/0136648 | A1 * | 6/2007 | Kwon et al. | 714/794 |
| 2009/0106626 | A1 * | 4/2009 | Hou et al. | 714/758 |
| 2011/0060969 | A1 * | 3/2011 | Ramamoorthy et al. | 714/773 |
| 2011/0154156 | A1 * | 6/2011 | Li et al. | 714/757 |

OTHER PUBLICATIONS

Generalized low-density parity-check codes for long-haul high-speed optical communications, Djordjevic, I.B., Milenkovic, O., Vasic, B.V., Optical Fiber Communication Conference, 2005, Technical Digest, OFC/NFOEC, Mar. 6-11, 2005. pp. 1-3, vol. 4.*

* cited by examiner

*Primary Examiner* — Christopher McCarthy
(74) *Attorney, Agent, or Firm* — Joseph Kolodka

(57) ABSTRACT

A method of encoding for optical transmission of information includes encoding information with a generalized low-density parity-check (GLDPC) code for providing coding gains, and constructing the GLDPC code with a Reed-Muller RM code as a component code, the component code being decodable using a maximum posterior probability (MAP) decoding. In a preferred embodiment, the GLDPC code includes a codeword length of substantially 4096, an information word length of substantially 3201, a lower-bound on minimum distance of substantially greater than or equal to 16, a code rate of substantially 0.78 and the RM component code includes an order of substantially 4 and an r parameter of substantially 6.

19 Claims, 2 Drawing Sheets

GLDPC ENCODING WITH REED-MULLER COMPONENT CODES FOR OPTICAL COMMUNICATIONS

This application claims the benefit of U.S. Provisional Application No. 60/954,843, entitled "Generalized LDPC Codes with Reed-Muller Component Codes suitable for Optical Communications", filed on Aug. 9, 2007, the content of which is incorporated by reference herein.

FIELD OF THE INVENTION

The present invention relates generally to optical communications, and more particularly, generalized low-density parity-check code (GLDPC) encoding with Reed-Muller (RM) component codes for optical communications.

BACKGROUND OF THE INVENTION

The state-of-the-art fiber-optics communication systems standardized by the ITU employ different concatenated Bose-Chaudhuri-Hocquenghem (BCH)/Reed-Solomon (RS) codes. Recently, iteratively decodable codes, turbo and low-density parity-check (LDPC) code, have generated significant research attention. It has been shown that turbo product codes (TPCs) can be matched and outperformed by LDPC codes in terms of coding gain and decoding complexity. Generalized low-density parity-check (GLDPC) coding can further improve the overall characteristics of LDPC codes by decreasing the complexity of the decoder, which is of high importance for optical communications. The main idea behind the GLDPC codes is to replace the parity-check equations in a parity-check matrix of global LDPC code by a linear block code. The decoding is based on a combination of simple and fast soft-input-soft-output (SISO) linear block decoders operating in parallel. The bit reliabilities obtained by SISO decoders are passed to the message-passing decoder operating on a bipartite graph of a global LDPC code. The SISO decoders are commonly designed as maximum a posteriori probability (MAP) decoders, such as Bahl-Cocke-Jelinek-Raviv (BCJR) decoder, and provide accurate estimates of bit reliabilities for a global LDPC decoder after small number of iterations. Due to high-complexity of the BCJR decoder, the GLDPC coding is limited to simple linear block component codes such as Hamming codes.

Accordingly, there is a need for generalized low-density parity-check code GLDPC encoding that provides excellent coding gains while low-complexity decoding.

SUMMARY OF THE INVENTION

A method of encoding for optical transmission of information includes encoding information with a generalized low-density parity-check (GLDPC) code for providing coding gains, and constructing the GLDPC code with a Reed-Muller RM code as a component code, the component code being decodable using a maximum posterior probability (MAP) decoding. In a preferred embodiment, the GLDPC code includes a codeword length of substantially 4096, an information word length of substantially 3201, a lower-bound on minimum distance of substantially greater than or equal to 16, a code rate of substantially 0.78 and the RM component code includes an order of substantially 4 and an r parameter of substantially 6.

BRIEF DESCRIPTION OF DRAWINGS

These and other advantages of the invention will be apparent to those of ordinary skill in the art by reference to the following detailed description and the accompanying drawings.

DETAILED DESCRIPTION

The invention is directed to generalized low-density parity-check code GLDPC codes with Reed-Muller RM codes as component codes that is an attractive option for high-speed optical transmission because they provide excellent coding gains, while the RM codes can be decoded using low-complexity maximum a posteriori probability (MAP) decoding based on fast Walsh-Hadamard transform. Several classes of GLDPC codes (with component RM or BCH codes) outperforming the turbo product codes in terms of decoding complexity and coding gain are presented.

Figure 1:
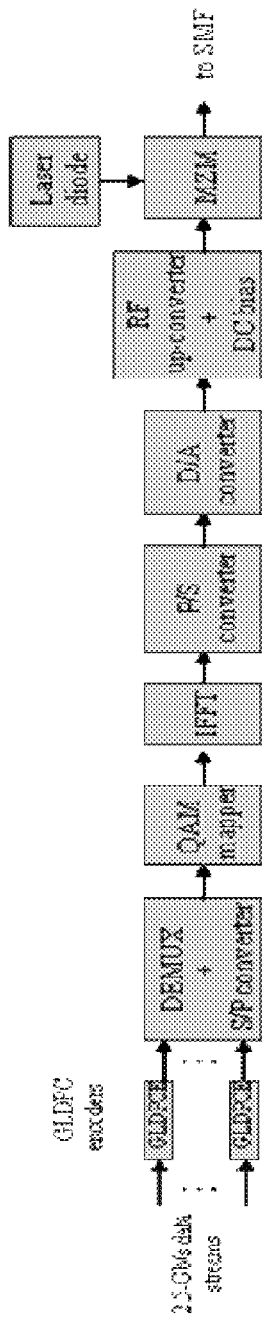
FIG. 1 is a block diagram of an exemplary optical transmitter helpful for explaining of the invention.

Referring now to FIG. 1, an exemplary transmitter for illustrating use of the invention is shown in FIG. 1. Some of the notations used are GLDPCE for a generalized low-density parity-check encoder, P/S for a parallel-to-serial converter, MZM for a Mach-Zehnder modulator and D/A for digital-to-analog.

An information-bearing stream at 10 Gb/s is demultiplexed into four 2.5-Gb/s streams, which are further encoded using identical GLDPC codes. The outputs of GLDPC encoders are demultiplexed and parsed into groups of $b_s$ bits corresponding to an OFDM symbol. The $b_s$ bits in each OFDM symbol are subdivided into K sub-channels with $i^{th}$ sub-carrier carrying $b_i$ bits, $b_s = \Sigma b_i$. The $b_i$ bits from the $i^{th}$ sub-channel are mapped into a complex-valued signal from a $2^{b_i}$-point signal constellation such as QAM, which is considered in this application, using Gray mapping. For example, $b_i=2$ for QPSK and $b_i=4$ for 16-QAM. The complex-valued signal points from sub-channels are considered to be the values of the discrete Fourier transform (DFT) of a multi-carrier OFDM signal. By selecting the number of sub-channels K, sufficiently large, the OFDM symbol interval can be made significantly larger than the dispersed pulse-width of an equivalent single-carrier system, resulting in significantly reduced ISI due to PMD.

After a D/A conversion and RF up-conversion, the RF signal can be converted to optical domain using one of two possible options: (i) the OFDM signal can directly modulate the distributed feedback laser (DFB) laser, and (ii) the OFDM signal can be used as RF input of the Mach-Zehnder modulator (MZM). The DC bias component must be inserted to enable recovering the QAM symbols incoherently.

GLDPC Codes/TCPS with RM/BCH Component Codes

To construct a GLDPC code, one can replace each single parity-check equation of a global LDPC code by the parity-check matrix of a simple linear block code, known as the constituent (local) code, which has been proposed by others and we will refer to this construction as LZ-GLDPC code construction. In another construction proposed by others referred to here as B-GLDPC code construction, the parity-check matrix, H, is a sparse matrix partitioned into W sub-matrices $H_1, \ldots, H_W$. $H_1$ is a block-diagonal matrix generated from an identity matrix by replacing the ones by a parity-check matrix of a local code of codeword-length n and dimension k. Each sub-matrix $H_j$ is derived from $H_1$ by random column permutations. The code rate of a GLDPC code is lower bounded by $R=K/N \geq 1-W(1-k/n)$, where K and N denote the dimension and the codeword-length of a GLDPC code, W is the column weight of a global LDPC code, and k/n is the code rate of a local code (k and n denote the dimension and the codeword-length of a local code). The GLDPC codes with component Hamming codes have been considered by others, but here we are concerned with GDLPC codes with component codes based on RM or BCH codes. A Reed-Muller code RM(r,m) of order r and codeword length $n=2^m$ is the set of all binary vectors associated with coefficients of Boolean polynomials of degree at most r in m variables. The minimum distance of RM(r,m) code is $2^{m-r}$, and the dimension is determined as $$k = 1 + \binom{m}{1} + \ldots + \binom{m}{r}.$$

An interesting property of RM codes is that they can be defined recursively: $RM(r,m)=\{(a|a+b): a \in RM(r,m-1), b \in RM(r-1,m-1)\}$, where (x|y) denotes the concatenation operation. The generator matrix of RM(r,m) code, denoted as G(r,m), can be therefore defined recursively by $$G(r, m) = \begin{bmatrix} G(r, m-1) & G(r, m-1) \\ 0 & G(r-1, m-1) \end{bmatrix}, \quad (1)$$

and can be observed as two-level generalized concatenated code. RM(0,m) is a repetition code, RM(m−1,m) is a parity-check code, and RM(m,m) corresponds to $2^m$-tuples of a vector space. The generator matrix of RM(m,m) can be represented by $$G(m, m) = \begin{bmatrix} G(m-1, m) \\ 0\ 0\ \ldots\ 0\ 1 \end{bmatrix}. \quad (2)$$

Another interesting property of RM codes is that the dual of RM(r,m) code is another RM(m−r−1,m) code. Therefore, the generator matrix of RM(m−r−1,m) code can be used as the parity check matrix of RM(r,m) code. If the recursion (1) is applied successively several times the RM(r,m) can be decomposed into several parity-check codes RM(m'−1,m'), repetition codes RM(0,m'), and the first-order RM(1,m') codes. The MAP decoding of parity-check or repetition codes is trivial, while the first order RM(1,m') codes can be decoded using an efficient MAP decoding algorithm based on fast Hadamard-Walsh transform (FHWT). The overall complexity of that algorithm is in order $n' \log_2 n'$ (where $n'=2^{m'}$), which is significantly lower than complexity of the BCJR algorithm that requires about $n^{n-k+1}$ operations. Therefore, the complexity of GLDPC codes with RM component codes is of order $N \log_2 n$.

Since the complexity of sum-product algorithm is of order $(N_{LDPC}-K_{LDPC})w_r$, with $w_r$ being the row weight of LDPC code parity check matrix, by proper selection of global LDPC code length N and local RM code length n, the complexity of GLDPC codes is about $(N_{LDPC}-K_{LDPC})w_r/[(N/n)\Sigma(n' \log_2 n')]$ (n'<n) times lower. For example, RM(4,6) code can be decomposed using Eq. (1) on RM(1,2), RM(1,3), RM(2,2), RM(3,3), and RM(4,4) component codes. Decoding of RM(m',m') (m'=1,2,3,4) is trivial while the complexity of RM(4,6) is dominated by complexity of RM(1,3) decoding block and three RM(1,2) blocks, which is of order $\Sigma(n' \log_2 n')=8 \log_2 8+3\cdot 4 \log_2 4=48$. B-GLDPC code with W=2 and length N=4096 based on RM(4,6) code has therefore complexity 11 times lower than girth-8 column-weight-4 LDPC code of length 8547 (and row weight 21) considered in Section III. Notice also that GLDPC decoder for 4096 code contains 4096/64=64 decoder blocks [composed of RM(1,2), RM(2,3) and RM(m',m') (m'=1, ..., 4) decoders], operating in parallel, and this structure is suitable for FPGA or VLSI implementation.

The minimum distance of GLDPC codes is lower bounded by Tanner's inequality. From that inequality we can conclude that large girth leads to an exponential increase in the minimum distance, and large minimum distance of the local code d leads to an increase of the base. In order to keep the code rate high, in all simulations presented in Section III, we have selected column-weight of a global code to be W=2. In that case, if the girth of global code is g=8, the minimum distance of GLDPC code is simply $D \geq d^2$.

It is noted that BCH codes can be decoded using an efficient MAP algorithm with complexity $n/[(n-k)\log_2 n]$ times lower than that of BCJR algorithm. The turbo product TPCs based on BCH component codes are intensively studied for fiber-optics communications. It is noted that a TPC can be considered as a special case of B-GLDPC code composed of two sub-matrices $H_1$ and $H_2$ corresponding to parity-check matrices of outer and inner component codes, respectively; with permutation operation implemented using a block-interleaver approach. The TPCs can be decoded by sequentially decoding the columns and rows using the BCJR algorithm. However, due to high-complexity of BCJR algorithm, the sub-optimal low-complexity Chase II algorithm is commonly employed in practical applications. However, if inner code is based on RM codes, it can be decoded by employing Ashikhmin's algorithm, which provides accurate estimates of initial log-likelihood ratios.

For example, the product BCH(512,484)×RM(5,6) (of rate R=0.93) can be decoded using the MAP algorithm as inner RM(5,6) decoder (RM(5,6) code is in fact a simple parity check equation), and Chase II algorithm as outer BCH(512, 484) decoder. Another interesting example is RM(6,8)×RM(5,7) (R=0.905) product code. The inner RM(5,7) decoder can be implemented using Ashikhmin's MAP decoding algorithm, while the outer RM(6,8) decoder can be implemented using Chase II algorithm. Both examples are suitable for terrestrial long-haul optical transmission systems. Turbo product example suitable for submarine systems is BCH(128, 113)×BCH(256,239) TPC. It has been shown in that the complexity of TPC with extended Hamming component code is comparable to R=0.8 LDPC code, if fast Chase II algorithm is employed. However, the complexity of standard Chase II algorithm is about 5 times larger than that of fast Chase II algorithm for p=3, and consequently the complexity of TPCs with BCH component codes is higher than complexity of LDPC decoder.

The GLDPC codes proposed in this paper can be put in systematic form, so that the efficient encoding algorithm due to Zhang and Parhi can be employed. This algorithm can efficiently be performed in general purpose digital signal processors.

Performance Analysis And Conclusion

Figure 2:
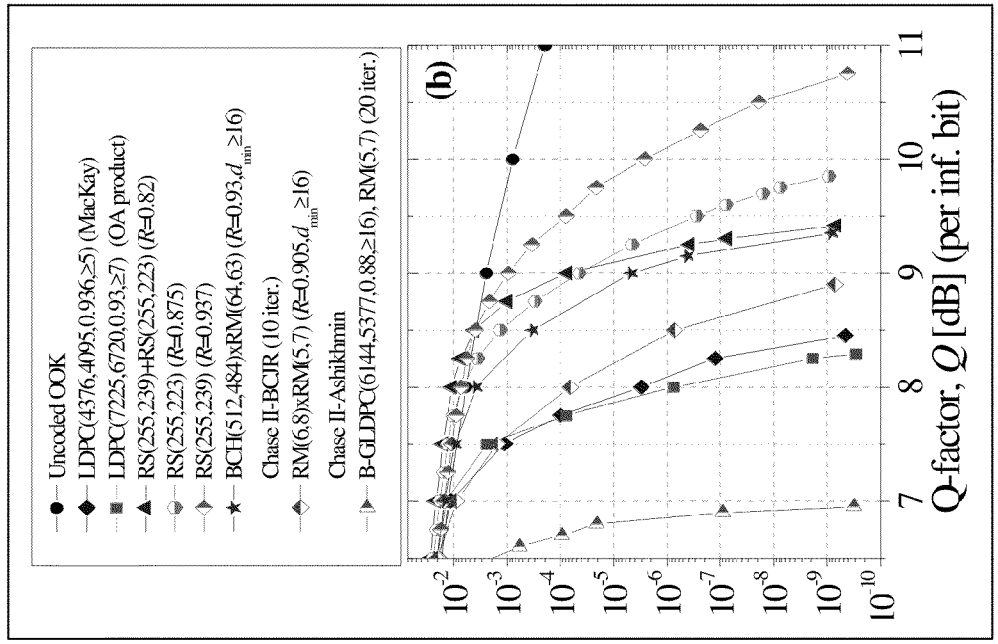
FIG. 2 includes charts that show the bit error rate BER performance on an AWGN channel for (a) GLDPC encoding in accordance with the invention compared to TPC codes and LDPC codes, (b) high rate codes.
Figure 2:
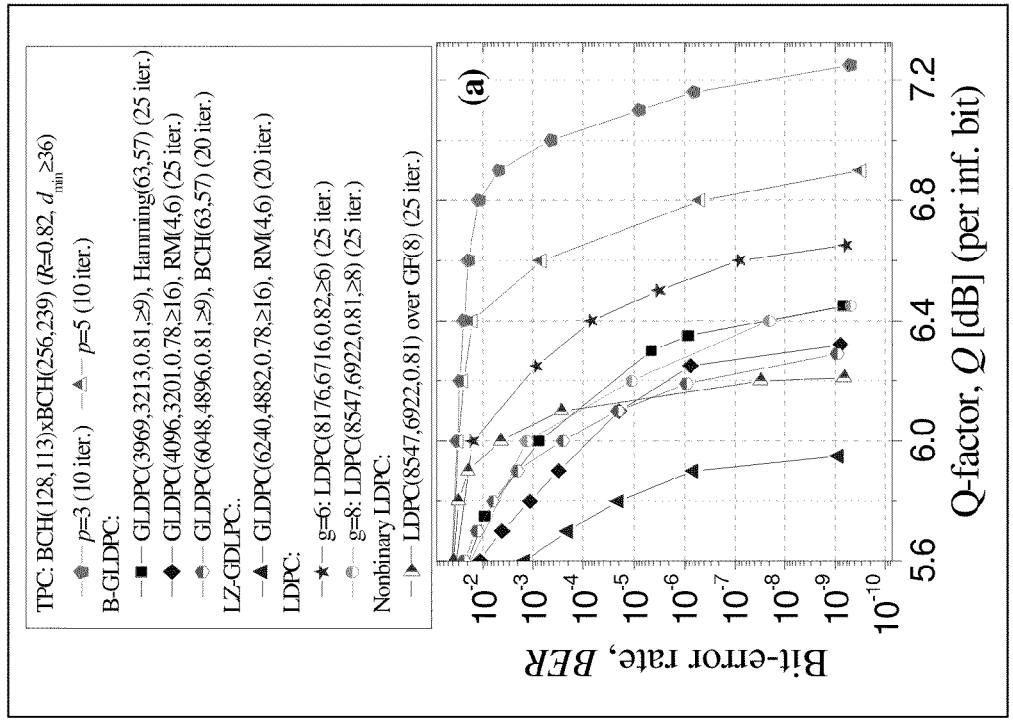

The results of simulation for the AWGN channel model are shown in FIG. 2, and are obtained by maintaining the doubleprecision. GLDPC codes based on BCH(63,57) and RM(4,6) component codes for W=2 perform comparably. The RM(4, 6)-based GLDPC code outperforms the BCH(128,113)× BCH(256,239) TPC based with Chase II decoding algorithm on p=3 least reliable bit positions by 0.93 dB at BER of $10^{-9}$ (see FIG. 2($a$)). Notice that similar TPC was implemented in LSI technology. The TPC codeword is significantly longer, and the decoding complexity of GLDPC code based on RM(4,6) is at least 10 lower. During decoding TPC decoder employs 239 Chase II blocks operating in parallel, while GLDPC code on RM(4,6) code requires only 64 low-complexity MAP decoders as explained in Section II. In simulations presented here we have employed an efficient realization of Chase II algorithm. In FIG. 2($b$) BER performance of several classes of iteratively decodable codes (TPCs, LDPC and GLDPC codes) of high code rate are compared against conventional RS, and concatenated RS codes. B-GLDPC code of rate 0.88 outperforms concatenated RS code of rate 0.82 by 2.47 dB (also at BER=$10^{-9}$). RM(6,8)×RM(5,7) TPC of rate 0.905 outperforms concatenated RS code (R=0.82) by 0.53 dB at BER of $10^{-9}$. LDPC code of rate 0.93, designed using the concept of product of orthogonal arrays (OAs), outperforms the same RS concatenated code by 1.15 dB at BER of $10^{-9}$. R=0.93 LDPC code outperforms RS code of rate 0.937 by 2.44 dB at BER of $10^{-9}$.

Figure 3:
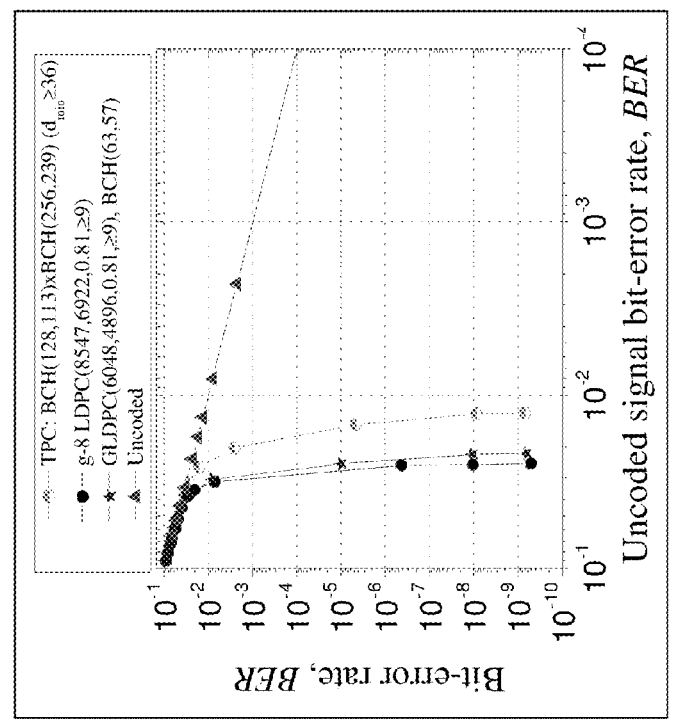
FIG. 3 shows GLDPC codes in accordance with the invention against TPC and LDPC codes at 40 Gbit/sec.

The results of simulations for the single channel transmission at 40 Gb/s, and dispersion map are shown in FIG. 3. The span length is set to L=120 km, and each span consists of 2L/3 km of D+fiber followed by L/3 km of D fiber. Pre-compensation of −320 ps/nm and corresponding post-compensation are also applied. RZ modulation format of a duty cycle of 33% is observed, and the launched power is set to 0 dBm. The GLDPC code of rate 0.81 and codeword length 6048 with BCH(63,57) code as component code, performs slightly worse than girth-8 LDPC code of the same rate and codeword length 8547. However, decoding complexity of GLDPC code is lower. Both GLDPC and LDPC codes, although of lower complexity, outperform BCH(128,113)×BCH(256,239) turbo product code of length 32768 and code rate 0.824. Notice that RM-based GLDPC codes require larger number of iterations than corresponding TPCs. On the other hand, the decoding algorithm of RM codes is based on FHWT, which for sequence of length n requires n $\log_2$n multiplications and additions, comparable to that of the fast Fourier transform (FFT).

Notice that parallel concatenated convolutional codes (PC-CCs), often used in wireless communications, have not been considered for use in optical communications because the PCCCs exhibit error floor phenomena around $10^{-6}$, while the targeted BERs in optical communications are well below $10^{-9}$ (often $10^{-15}$).

GLDPC codes with BCH and RM component codes are considered as possible options for high-speed optical transmission. It is demonstrated by simulation that the RM or BCH based GLDPC codes are able to outperform their turbo product counterparts in terms of coding gain with lower complexity for decoding. On the other hand, they require larger number of iterations. GLDPC codes perform comparably to girth-8 LDPC codes, but have lower complexity for decoding.

The inventive GLDPC codes with Reed-Muller (RM) component codes are an attractive option for high-speed optical transmission because they provide excellent coding gains. The RM codes can be decoded using low-complexity maximum a posteriori probability (MAP) decoding based on fast Walsh-Hadamard transform. The inventive GLDPC codes (with component RM codes) outperform turbo product codes in terms of decoding complexity and coding gain. Several classes of GLDPC codes suitable for high-speed implementation are introduced. RM(4,6) based GLDPC(4096,3201, 0.78,≧16) code (the parameters of code represent codeword length, information word length, code rate, and lower-bound on minimum distance, respectively), and BCH(63,57) based GLDPC(6048,4896,0.81,≧9) code of code rate 0.81 outperform TPC (employing Chase II algorithm operating on 3 least reliable bit positions) by 0.93 dB on an additive white Gaussian noise (AWGN) channel model at BER of $10^{-9}$. BER performances are also assessed using an advanced fiber-optics channel model. We also identify several classes of turbo-product codes with RM/BCH component codes suitable for use in optical communications.

The present invention has been shown and described in what are considered to be the most practical and preferred embodiments. It is anticipated, however, that departures may be made therefrom and that obvious modifications will be implemented by those skilled in the art. It will be appreciated that those skilled in the art will be able to devise numerous arrangements and variations, which although not explicitly shown or described herein, embody the principles of the invention and are within their spirit and scope.

What is claimed is:

1. A method of encoding for optical transmission of information comprising the steps of:
    encoding information with a generalized low-density parity-check (GLDPC) code for providing coding gains; and
    constructing the GLDPC code with a Reed-Muller (RM) code as a component code with modular structure of generator matrix, the component code being decodable using a maximum posterior probability (MAP) decoding; and
    decomposing a parity-check matrix of RM component code into a plurality of single-parity-check codes, repetition codes and first order RM codes.

2. The method of claim 1, wherein the GLDPC code comprises a codeword length of 4096.

3. The method of claim 1, wherein the GLDPC code comprises an information word length of 3201.

4. The method of claim 1, wherein the GLDPC code comprises a code rate of 0.78.

5. The method of claim 1, wherein the GLDPC code comprises a lower-bound on minimum distance of greater than or equal to 16.

6. The method of claim 1, wherein the RM code comprises an order of 4.

7. The method of claim 1, wherein the RM code comprises an r parameter of 6.

8. The method of claim 1, wherein the GLDPC code comprises a codeword length of 4096, an information word length of substantially 3201, a lower-bound on minimum distance of greater than or equal to 16, a code rate of 0.78 and the RM component code comprises an order of 4 and an r parameter of 6.

9. A method of encoding for optical transmission of information comprising:
    encoding information with generalized low-density parity-check (GLDPC) codes and component Reed-Muller (RM) code for providing large coding gains;
    constructing the GLDPC codes with RM component codes;
    transmitting the codes over an optical communication system;

decoding RM component codes by low-complexity maximum a posteriori probability (MAP) decoding algorithm;

decomposing a parity-check matrix of RM component code into a plurality of single-parity check codes, repetition codes and first order RM codes;

decoding the first order RM codes, obtained from decomposition, by fast Walsh-Hadamard transform; and globally decoding the codes based on a sum-product technique.

10. The method of claim 9, wherein the GLDPC codeword length is a multiple of component RM codeword length.

11. The method of claim 9, wherein the code parity-check matrix has a row-weight that is the same as a component RM code codeword length.

12. The method of claim 9, wherein code parity-check matrix rows are replaced with a parity-check matrix of component RM code in accordance with nonzero locations.

13. The method of claim 9, wherein the parity-check matrix of the component RM code is obtained as a generator matrix of a corresponding dual RM code and wherein the RM generator and parity-check matrix have highly regular, modular structure.

14. The method of claim 9, wherein component RM decoder exploits regular, modular structure of parity-check matrix of RM code by splitting the RM code into single-parity check codes, repetition codes and first order RM codes.

15. The method of claim 9, wherein component RM decoder performs MAP decoding of decomposed RM code and wherein the MAP decoding of first order RM codes is based on fast Walsh-Hadamard transform.

16. The method of claim 9, comprising component RM decoders that pass the reliability data to a global LDPC code.

17. The method of claim 9, wherein a global LDPC code is a large-girth code.

18. The method of claim 9, comprising a global LDPC decoder based on a sum-product technique, with sum-product updating rule based on MAP decoding of component RM codes.

19. The method of claim 9, wherein extrinsic reliabilities are iterated between a global LDPC decoder and component RM codes until a GLDPC codeword is generated or until a pre-determined number of iterations has been reached.

* * * * *